(12) United States Patent
Zielke

(10) Patent No.: US 8,287,714 B2
(45) Date of Patent: *Oct. 16, 2012

(54) CONTINUOUS PLATING SYSTEM AND METHOD WITH MASK REGISTRATION

(75) Inventor: Darrell W. Zielke, Bothell, WA (US)

(73) Assignee: Leviton Manufacturing Co., Inc., Melville, NY (US)

( * ) Notice: Subject to any disclaimer, the term of this patent is extended or adjusted under 35 U.S.C. 154(b) by 648 days.

This patent is subject to a terminal disclaimer.

(21) Appl. No.: 12/487,068

(22) Filed: Jun. 18, 2009

(65) Prior Publication Data

US 2009/0255821 A1   Oct. 15, 2009

Related U.S. Application Data

(60) Division of application No. 11/278,947, filed on Apr. 6, 2006, now Pat. No. 7,744,732, which is a continuation-in-part of application No. 11/388,245, filed on Mar. 23, 2006, now Pat. No. 7,655,117.

(60) Provisional application No. 60/669,070, filed on Apr. 6, 2005.

(51) Int. Cl.
*C25D 5/02* (2006.01)

(52) U.S. Cl. ...................................................... 205/129

(58) Field of Classification Search .................. 205/129, 205/137, 138
See application file for complete search history.

(56) References Cited

U.S. PATENT DOCUMENTS

| | | | |
|---|---|---|---|
| 2,341,158 A | 2/1944 | Nachtman | |
| 2,591,042 A | 4/1952 | Berman et al. | |
| 3,483,113 A | 12/1969 | Carter | |
| 3,661,752 A | 5/1972 | Capper et al. | |
| 3,855,108 A * | 12/1974 | Bolz et al. | 204/206 |
| 3,951,772 A | 4/1976 | Bick et al. | |
| 4,064,019 A | 12/1977 | Eidschun, Jr. | |
| 4,264,416 A | 4/1981 | Noz | |
| 4,405,432 A | 9/1983 | Kosowsky | |
| 4,409,924 A | 10/1983 | Laverty et al. | |
| 4,431,500 A | 2/1984 | Messing et al. | |
| 4,452,684 A | 6/1984 | Palnik | |
| 4,529,486 A | 7/1985 | Polan | |
| 4,818,349 A | 4/1989 | Smith | |
| 4,921,583 A | 5/1990 | Sewell | |

(Continued)

FOREIGN PATENT DOCUMENTS

JP   2003183878   7/2003

(Continued)

OTHER PUBLICATIONS

Advisory Action received in U.S. Appl. No. 11/278,947 dated Mar. 11, 2010, 3 pages.

(Continued)

*Primary Examiner* — Luan Van
(74) *Attorney, Agent, or Firm* — Davis Wright Tremaine LLP; George C. Rondeau, Jr.; Heather M. Colburn

(57) ABSTRACT

A continuous plating system with mask registration is disclosed herein that uses drums and rollers with protruding pins which engage with guide holes in a masking belt and a lead frame. Through engagement with the pins the masking belt is keyed to the lead frame as the lead frame passes through a plating solution tank.

29 Claims, 15 Drawing Sheets

U.S. PATENT DOCUMENTS

| | | | |
|---|---|---|---|
| 5,188,720 | A | 2/1993 | Colin et al. |
| 5,242,562 | A | 9/1993 | Beyerle et al. |
| 5,272,699 | A | 12/1993 | Nobutoki et al. |
| 5,282,945 | A * | 2/1994 | Riscke et al. ............... 204/206 |
| 5,372,699 | A | 12/1994 | Rischke et al. |
| 5,462,649 | A | 10/1995 | Keeney et al. |
| 5,705,043 | A | 1/1998 | Zwerner et al. |
| 6,123,473 | A | 9/2000 | Guillen et al. |
| 7,655,117 | B2 | 2/2010 | Zielke |
| 7,744,732 | B2 | 6/2010 | Zielke |
| 8,182,655 | B2 | 5/2012 | Zielke |
| 2003/0188965 | A1 | 10/2003 | King et al. |
| 2006/0226017 | A1 | 10/2006 | Zielke |
| 2007/0045786 | A1 | 3/2007 | Zielke |
| 2008/0188163 | A1 | 8/2008 | Duong |
| 2009/0057158 | A1 | 3/2009 | Zielke |
| 2009/0242412 | A1 | 10/2009 | Zielke |

FOREIGN PATENT DOCUMENTS

| | | |
|---|---|---|
| WO | PCT/US86/00829 | 4/1987 |
| WO | 2006/108140 | 10/2006 |

OTHER PUBLICATIONS

Final Rejection received in U.S. Appl. No. 11/278,947 dated Jan. 5, 2010, 16 pages.

Final Rejection received in U.S. Appl. No. 12/204,107 dated Oct. 18, 2011, 21 pages.

Information Disclosure Statement Transmittal Letter filed herewith on May 24, 2012, 2 pages.

International Search Report issued in International Patent Application No. PCT/US06/13020 on Sep. 1, 2006, 1 page.

Non-Final Office Action mceived in U.S. Appl. No. 11/388,245 dated Jul. 6, 2009, 15 pages.

Non-Final Office Action received in U.S. Appl. No. 11/278,947 dated Jul. 24, 2009, 17 pages.

Non-Final Office Action received in U.S. Appl. No. 12/204,107 dated Jun. 24, 2011, 25 pages.

Non-Final Office Action received in U.S. Appl. No. 12/482,904 dated Feb. 24, 2012, 11 pages.

Notice of Allowance received in U.S. Appl. No. 11/388,245 dated Dec. 1, 2009, 7 pages.

Notice of Allowance receiv in U.S. Appl. No. 11/278,947 dated Apr. 9, 2010, 7 pages.

Notice of Allowance received in U.S. Appl. No. 12/204,107 dated Apr. 23, 2012, 9 pages.

Restriction Requirement received in U.S. Appl. No. 11/278,947 dated May 4, 2009, 5 pages.

* cited by examiner

CONTINUOUS PLATING SYSTEM AND METHOD WITH MASK REGISTRATION

CROSS REFERENCE TO RELATED APPLICATIONS

This application is a division of U.S. patent application Ser. No. 11/278,947 filed Apr. 6, 2006, which claims priority from provisional application Ser. No. 60/669,070 filed Apr. 6, 2005, and is a continuation-in-part of non-provisional application Ser. No. 11/388,245 filed Mar. 23, 2006.

BACKGROUND OF THE INVENTION

1. Field of the Invention

The present invention is generally related to plating systems, and more in particular, continuous plating systems.

2. Description of the Related Art

Conventional approaches for plating metals onto portions of targeted parts can involve either a generally more precise step-and-repeat plating for plating selective locations or a generally faster continuous strip plating for plating portions of parts whose intended plating areas can be arranged in an uninterrupted path. Such targeted parts can be found joined together in a lead frame. A lead frame can be formed as a long continuous strip containing duplicate copies of a particular part. The lead frame can be fed through machines to perform various physical manipulations on each of the parts of the lead frame in an orderly stepwise fashion so that each of the parts has its turn to undergo each of the physical manipulations performed by the machines.

With the conventional step-and-repeat plating process, a precise mask of finite length is positioned over a section of a lead frame having a series of parts. The mask has various openings so that for each part of the masked lead frame section, those portions of the part that are to be plated remains unmasked. The unmasked portions of the parts of the masked lead frame section are subsequently exposed to a plating solution to accomplish their plating.

The lead frame is typically negatively charged to plate those exposed areas of the lead frame when they receive plating solution such as by pouring, spraying, or brushing the solution from a positively charged applicator, such as a nozzle. After the unmasked portions of the parts of the masked lead frame section have been plated, a new section of the lead frame is moved to be masked and to further repeat the step-and-repeat process.

Some implementations of the step-and-repeat process involve perforated tape masks that are each used for a portion of the lead frame and are subsequently removed and discarded after plating of the respective portion of the lead frame is accomplished. Although the step-and-repeat process can be used for precision plating so that relatively little plating material is wasted, the process can be inherently slow and labor intensive.

With a conventional continuous plating system, the lead frames can be run at constant velocity through the plating system therefore potentially reducing labor requirements and potentially increasing throughput. Conventional continuous plating systems include a de-reeler, welding apparatus, tanks, guide devices, masking belt and a re-reeler. The de-reeler feeds the lead frame from a first reel into the plating system. The welding apparatus includes a spot welder and a welding fixture to attach subsequent reels of lead frames to be fed into the plating system.

The tanks includes a series of cleaning, plating and washing tanks to electroplate nickel, gold or other precious metals on to portions of the parts of the lead frame. The guide devices are fashioned to direct the lead frame through the tanks while trapping the parts between the moving masking belts. The masking belt exposes one or more portions of each part of the lead frame through one or more openings in the masking belt to plating solution to be plated and covers other portions of each part to prevent those portions from being plated.

The re-reeler spools the plated parts onto a second reel as the parts emerge from the plating system. Within reason, the longer the portion of the lead frame that can be exposed to the plating solution at any one time, the faster the lead frame can be run through the continuous plating system and consequently, the faster the throughput of the continuous plating system.

Although conventional continuous plating systems can have relatively faster throughput than the conventional step-and-repeat plating systems, there is a price for this faster throughput with conventional continuous plating systems. Namely, conventional continuous plating systems tend to be more wasteful of the plating materials.

A problem exists with conventional continuous plating systems in that the masking belt typically shifts back and forth in position orthogonal to its direction of motion, also referred to as trans-linear motion. This trans-linear motion causes a shift back and forth in position of each of the openings in the masking belt relative to its associated lead frame part to be masked. The trans-linear back and forth shifting of position of the opening thus creates uncertainty as to where the opening will be positioned with respect to the particular lead frame part at the point when plating of the part occurs.

Consequently, if the opening was only as large as its corresponding desired portion of the part to receive plating, this desired portion of the part may not be fully plated. Through the trans-linear shifting, the opening may not be properly positioned over the part at the time of plating. Rather, the opening may be somewhat out of position and if the opening was only the size of the desired portion of the part to be plated, not all of the desired portion of the part would be exposed through the opening to receive the plating solution.

Thus, to compensate for this shifting due to the trans-linear motion, each of the openings are enlarged enough so that no matter where an opening is in its back and forth trans-linear motion, all of the desired portion of the part to be plated is still exposed through the opening to receive the plating solution. This compensation, however, has a price. Since the opening in the masking belt is larger than the desired portion of the part to be plated, areas of the part that do not require plating will be resident in the area of the opening and will be plated, which wastes the plating metal.

This enlargement of the opening larger than the desired portion of the part to be plated is referred to as over-plating. With some conventional implementations of continuous plating systems an over-plating of 0.06 inches on either side of the desired portion of the part to be plated is not an unusual value.

Some conventional implementations of the continuous plating system may try to use masking belts of relatively greater thickness to possibly reduce the amount of trans-linear motion. A drawback of increased masking belt thickness is a result referred to as a wall effect in which the mask thickness inhibits the thickness of the plating near the edge of the opening. The combination of an opening of the belt mask with one of the lead frame parts forms a sort of canyon with the part acting as sort of the floor of the canyon and the edges of the opening acting somewhat like vertical walls of the canyon.

As the lead frame part is pressed with the mask belt and is moved through the tank of plating solution, the plating solution enters the so called canyon, but interaction of the plating solution with the walls of the canyon somewhat hinders the plating solution from depositing plating material to as great an extent on the floor of the canyon (a portion of a part of the lead frame) near the walls of the canyon (edges of the opening) when compared to the amount of plating material deposited farther away from the walls.

As a result, the plating material on a plated portion of a part has an uneven thickness, being thinner near the edges of the plated portion and being thicker near the center of the plated portion. Generally speaking, the thicker the belt mask, the larger the difference in thickness is between the edges and the center of a given plated portion. Resultant uneven plating can also waste plating material because more plating material may need to be used in a center of a plated portion in order to have a sufficient amount of plating material near the edges of the plated portion.

The cost of plating precious metals is primarily determined by the amount of gold or other precious metal used and the throughput speed involved. The two conventional approaches discussed raise costs by either being relatively slow and labor intensive, or by being relatively wasteful of plating material.

BRIEF DESCRIPTION OF THE SEVERAL VIEWS OF THE DRAWING(S)

DETAILED DESCRIPTION OF THE INVENTION

Figure 1:
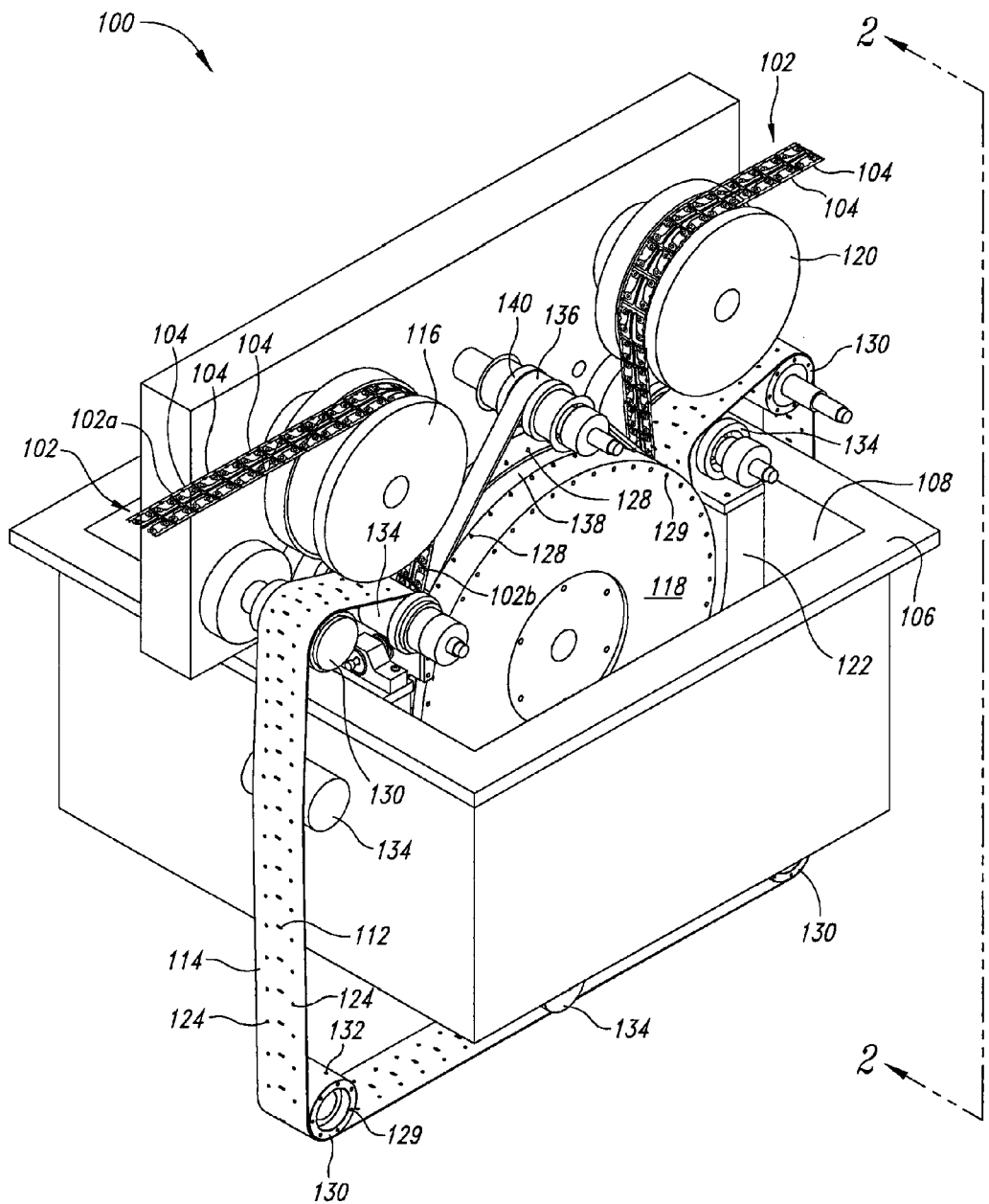
FIG. 1 is an isometric view of a continuous plating system with mask registration.

A continuous plating system with mask registration is disclosed herein that uses drums and rollers with protruding pins which engage with guide holes in a masking belt and a lead frame. Through engagement with the pins the masking belt is keyed to the lead frame as the lead frame passes through a plating solution tank. The continuous plating system can be used to maintain precise registry both in the direction of part travel and perpendicular to travel of the parts to be plated for spot plating. The masking belt has openings that remain in registered positions relative to associated parts on the lead frame so that little if any trans-linear motion occurs and so that part areas to be plated are exposed to plating solution accurately and consistently. This can greatly reduce the amount of over-plating present.

Furthermore, in some implementations, due in part to the relative lack of trans-linear motion through registration of the masking belt with the lead frame, the thickness of the masking belt can be reduced. This reduction in thickness of the masking belt can result in a reduction of potential wall effects resulting in more consistent plating thickness. As a consequence, the amount of plating material used for a given application can be reduced.

As will be described in greater detail, the continuous plating system with mask registration teaches in general, systems and methods that selectively electroplate a strip of material, such as a lead frame, in continuous fashion. At one stage of travel, the strip engages with pins of a relatively large externally drive wheel, is looped partially around the drive wheel, and is consequently pulled through an open top plating tank of electrolyte solution. Before the strip is sent through the tank, a loop of perforated masking material, otherwise referred to herein as a masking belt, also engages with the pins of the drive wheel to be registered in step with the strip so as to precisely expose only the areas on the strip which require plating as the strip passes through the tank.

In an exemplary implementation, the drive wheel has its periphery sized in circumference to accommodate pins all substantially equally spaced around the circumference of the drive wheel. The pitch spacing of the pins around the first drum circumference and around the wheel circumference is matched to the pitch spacing of guide holes in the strip so that in these implementations, the circumference of the first drum, the circumference of the drive wheel, and any other circumference having pins is divisible by the pitch spacing of the pins. Material selection for the drive wheel and masking belt also considers thermal expansion due to operating temperatures of the plating solution.

For instances in which the strip is a lead frame, a lead frame typically requires such guide holes for a hitch feed mechanism used in the progressive dies that stamp and form the parts of the lead frame. The masking belt is punched with holes at the same pitch spacing as guide holes on the strip and pins on the drive wheel for registry with the strip. The masking belt is also punched with openings to match areas on the strip requiring the selective plating. In construction of the masking belt, a fixture with punch and die is used for adjustable and accurate pitch spacing of masking belt guide holes. Care is also used when splicing the masking belt material together to form the masking belt to insure that pitch spacing of the guide holes is maintained.

A spring loaded compliance arm can be used to trap the strip between the drive wheel and the masking belt. Additionally, tracking rollers also equipped with pins are used in the return path of the masking belt to better insure stable tracking of the belt. The tracking rollers also permit use of a thin masking belt design to reduce wall effects. Before and after engagement with the drive wheel, the strip is drawn over rotating negatively charged first and second drums, respectively, which provide the cathode of the process.

A band concentric and in close proximity to the periphery of the portion of the drive wheel in the plating solution provides the anode of the circuit. The band is fluted to allow plating solution to be continuously pumped through the flutes to be in proximity to the masked portions of the strip. This fluid motion and rapid exchange accelerates and maintains the consistency of the plating process.

As shown in FIG. 1, a continuous plating system 100 sequentially receives a strip, such as a lead frame 102, having a first side 102*a* and a second side 102*b* and having duplicate copies of a part 104 serially arranged along the lead frame, each of the parts to be plated on one or more portions of the second side. Serial portions of the lead frame 102 are sequentially moved in a continuous manner by the system 100 into a tank 106 of plating solution 108 and sequentially emerge from the tank with a portion of the second side 102*b* being plated. The parts 104 are sequentially plated on the second side 102*b* on portions of the parts exposed to the plating solution 108 through serially arranged openings 112 of a masking belt 114. The masking belt 114 is made from a low profile rubber covered polyamide core material, such as rapplon, which survives associated environmental and mechanical abuse, performs as an effective mask, and minimizes wall effect by its low profile.

In the depicted implementation, there is one of the openings 112 for each of the parts 104, but in other implementations there can be more than one of the openings for each of the parts. Serial portions of the lead frame 102 are sequentially received by a first cathode drum 116 of the system 100 around whose circumference the lead frame is partially wrapped to be directed downward in a continuous manner toward the plating solution 108. The first cathode drum 116 imparts a negative charge to the serial portions of the lead frame 102 through conductive properties of the lead frame to attract positively charged metal constituents of the plating solution 108. Upon sequentially leaving the first cathode drum 116, serial portions of the lead frame 102 join with serial portions of the masking belt 114 to be sequentially wrapped around the partial circumference of an electrically non-conductive carrier or drive wheel 118 which is rotatable about its axis. In some implementations, material used for the drive wheel 118 is an acrylic plastic, which also has predictable thermal expansion properties.

The drive wheel 118 sequentially guides the serial portions of the lead frame 102 and the masking belt 114 through the plating solution 108. After plating is sequentially accomplished, serial portions of the lead frame 102 and the masking belt 114 sequentially emerge from the plating solution 108 and they separate from one another. Serial portions of the lead frame 102 then sequentially wrap partially around a second cathode drum 120, which imparts a negative charge to the lead frame, and then sequentially exit the system 100.

Figure 2:
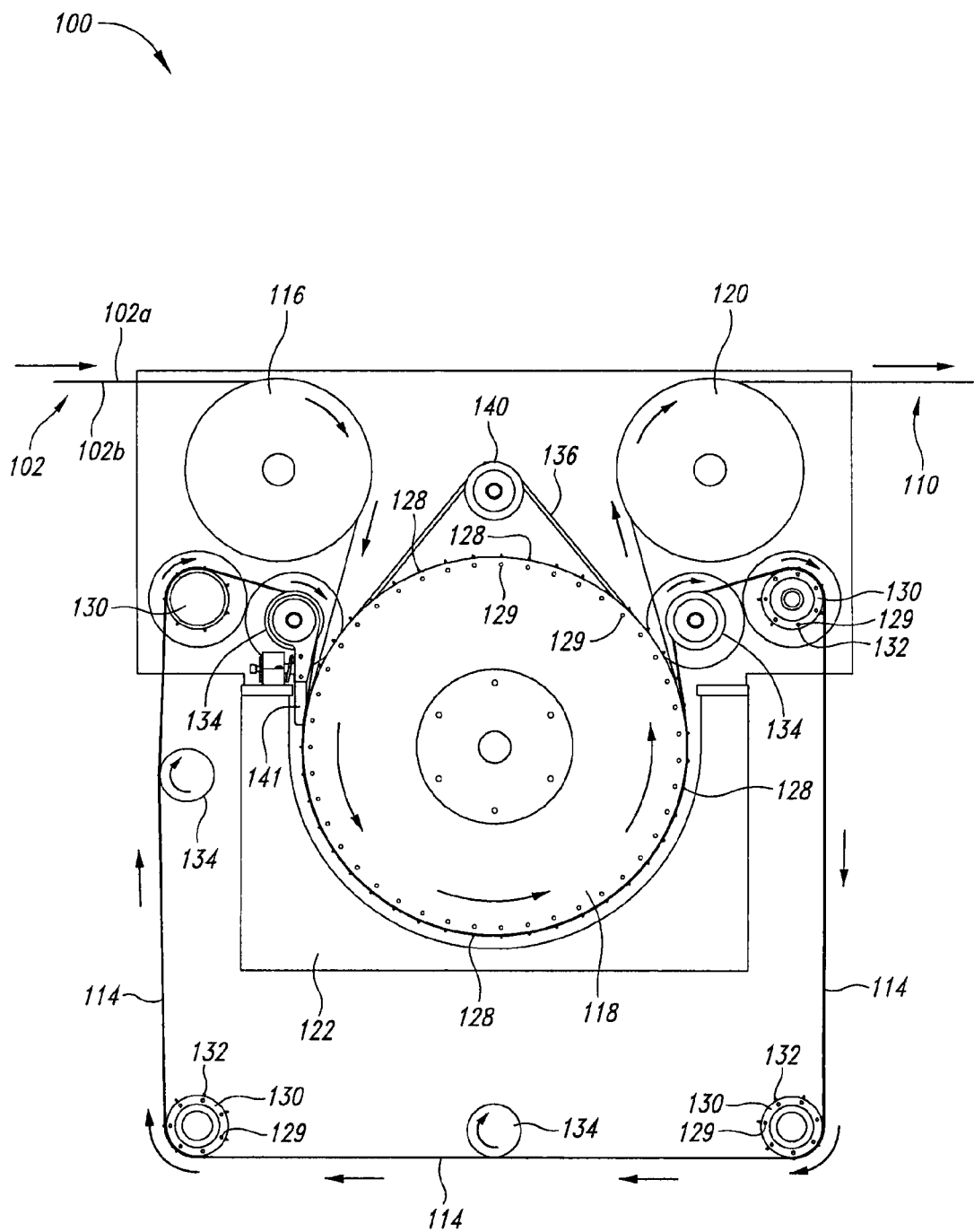
FIG. 2 is a cross-sectional view of the plating system taken substantially along the line 2-2 of FIG. 1.
Figure 3:
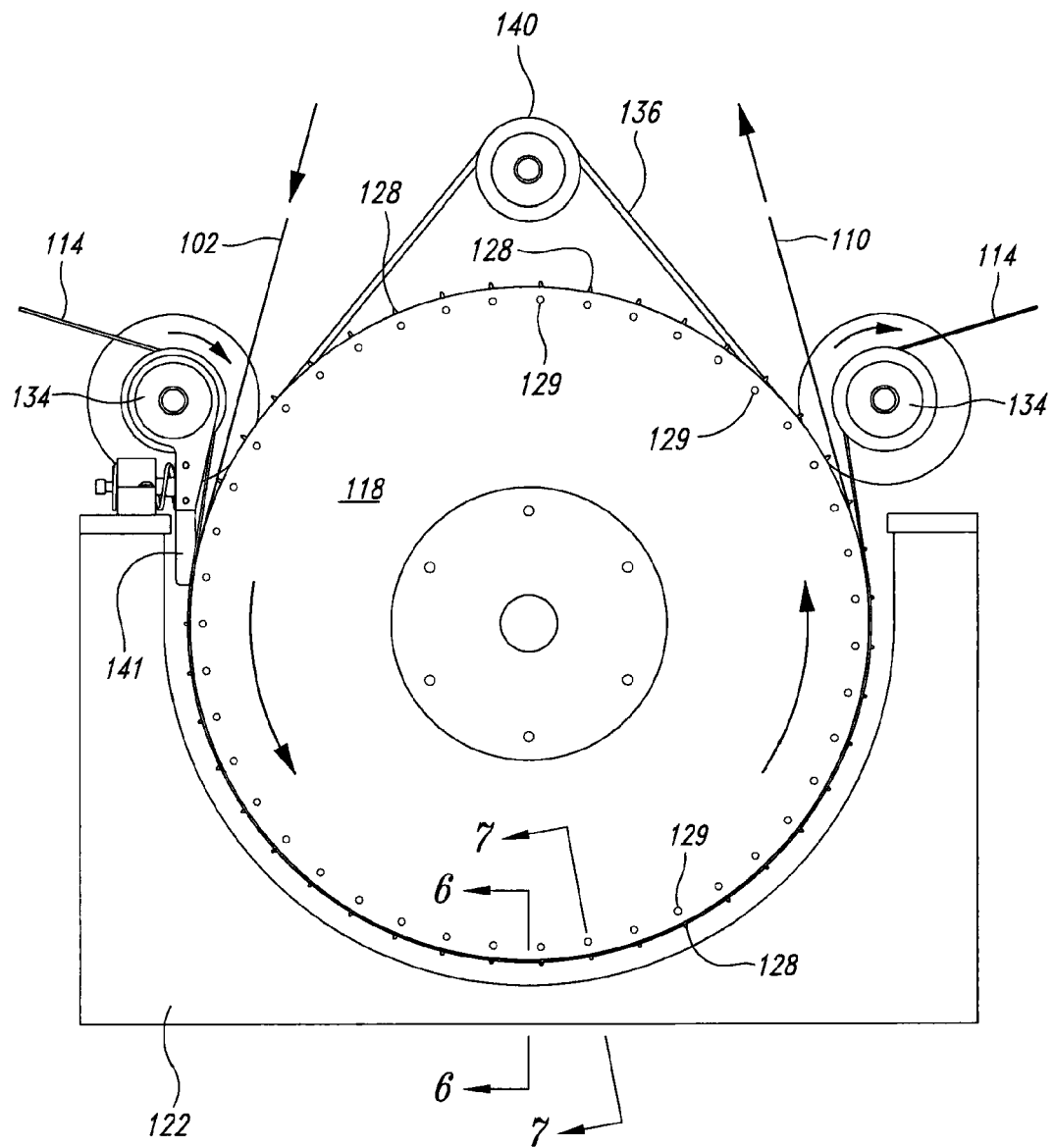
FIG. 3 is an enlarged, cross-sectional view of a portion of the plating system of FIG. 1.

As serial portions of the lead frame 102 and serial portions of the masking belt 114 sequentially pass through the plating solution 108, they sequentially pass by a fluted anode member or band 122 better shown in FIGS. 2 and 3. The fluted anode band 122 has a profile inverse to a portion of the circumference of the drive wheel 118 and extends along a portion of the periphery of the drive wheel in close proximity to the drive wheel. The band 122 imparts a positive charge to constituents of the plating solution 108 as the plating solution passes through flutes of the band as described further below.

Figure 4:
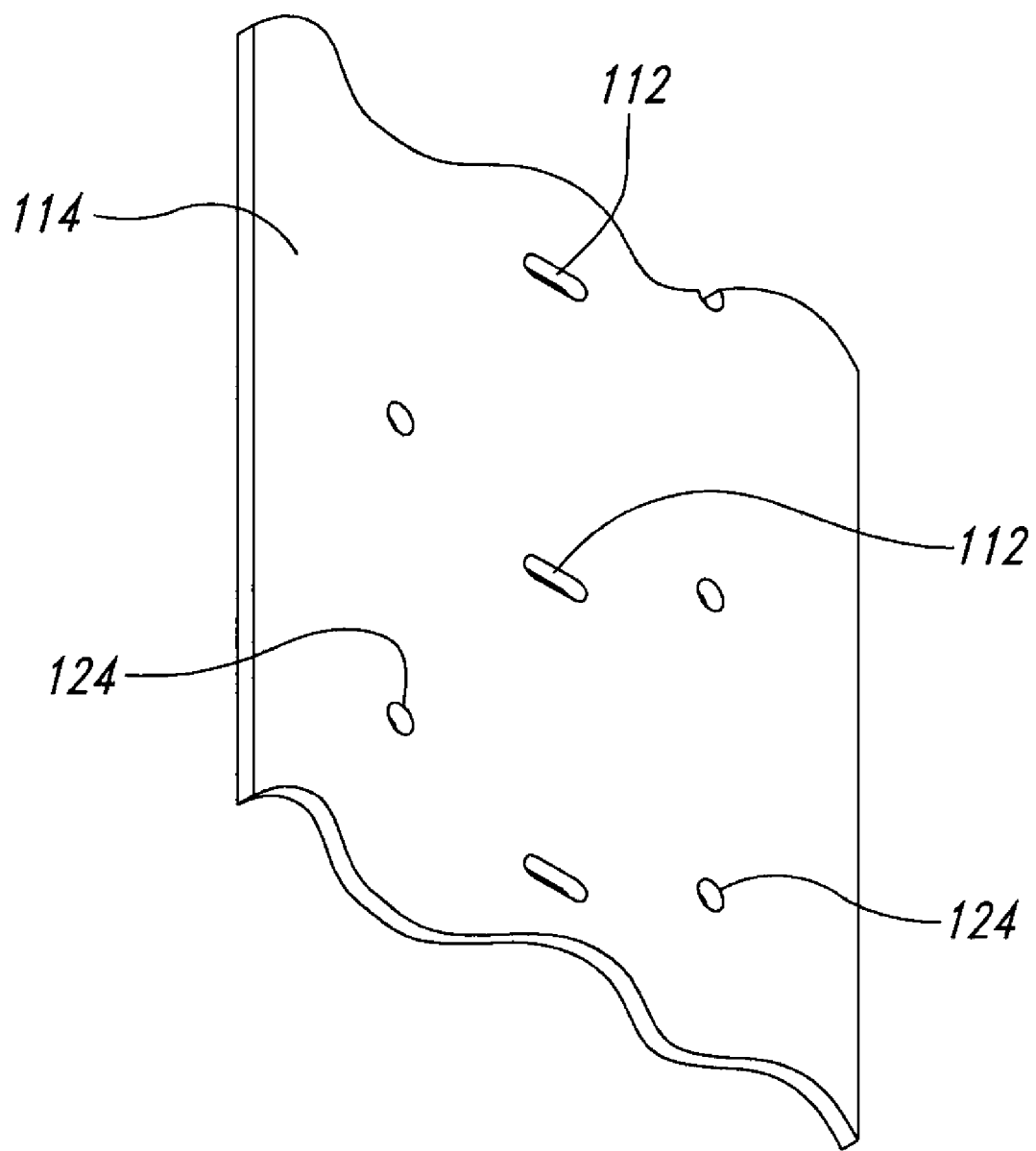
FIG. 4 is an enlarged fragmentary view of the masking belt of the plating system.
Figure 5:
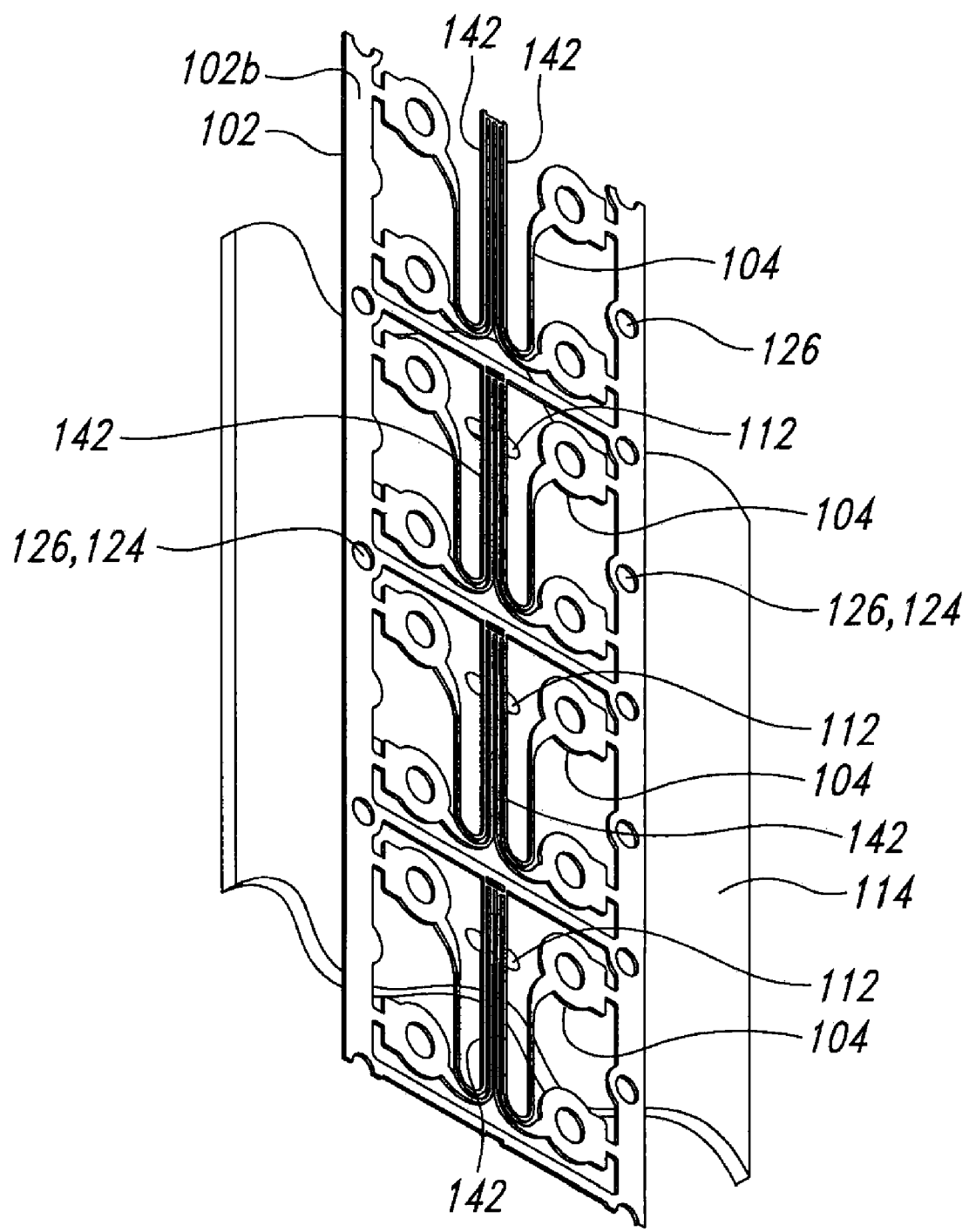
FIG. 5 is an enlarged section view of the masking belt coupling with the lead frame of the plating system.
Figure 6:
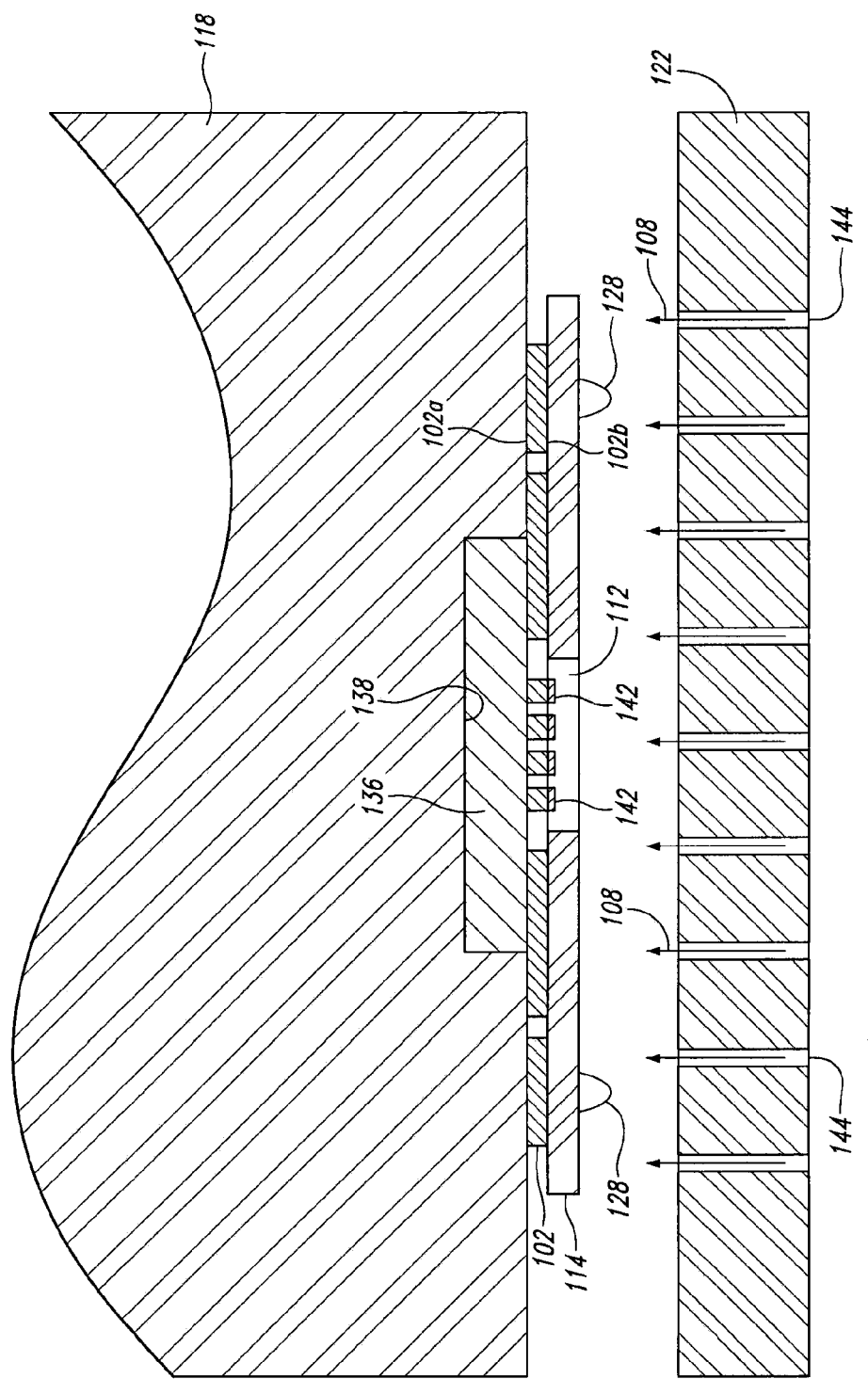
FIG. 6 is a cross-sectional view of the plating system taken substantially along the line 6-6 of FIG. 3.
Figure 7:
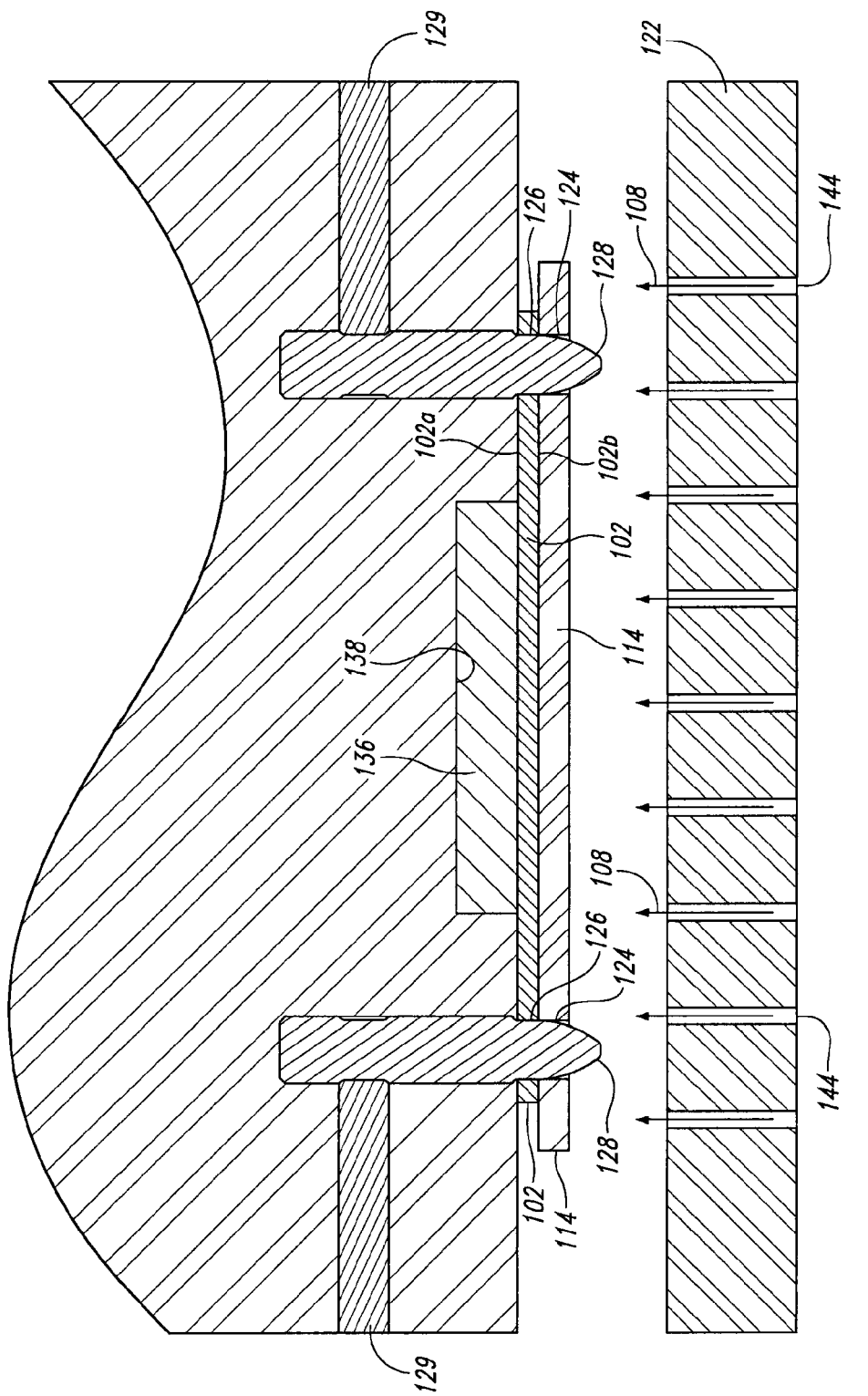
FIG. 7 is a cross-sectional view of the plating system taken substantially along the line of 7-7 FIG. 3.

The masking belt 114 has substantially equally spaced guide holes 124, better shown in FIG. 4, and the lead frame 102 has substantially equally spaced guide holes 126, better shown in FIG. 5. The guide holes 124 of the masking belt 114 and the guide holes 126 of the lead frame 102 have substantially the same spacing. As serial portions of the lead frame 102 and serial portions of the masking belt 114 sequentially approach the drive wheel 118 each of the guide holes 124 of the masking belt align with a different one of the guide holes 126 of the lead frame 102, as shown in FIG. 5, to receive a pin 128 of the drive wheel, as shown in FIGS. 6 and 7. As shown in FIG. 7, in the depicted embodiment, the pins 128 are held in position by side tap screws 129 countersunk into the drive wheel 118. After plating as the serial portions of the lead frame 102 and the masking belt 114 sequentially separate from each other, the guide holes 124 of the masking belt and the guide holes of the lead frame disengage from the pins 128 of the drive wheel 118, as shown in FIG. 3.

Tracking rollers 130, shown in FIGS. 1 and 2, with pins 132 are positioned along the path of the masking belt 114 to keep the masking belt in proper alignment at the point where serial portions of the masking belt sequentially join with serial portions of the lead frame 102. The pins 132 are substantially equally spaced along the circumference of the tracking rollers 130 and are spaced from one another the same distance as found with the guide holes 124 of the masking belt 114. As serial portions of the masking belt 114 sequentially pass by one of the tracking rollers 130, the guide holes 124 of the masking belt engage with the pins 132 of the tracking roller. Thus, the tracking rollers 130 help to prevent or lessen the amount of trans-linear motion of the masking belt 114.

Belt pulleys 134 are positioned along the path of the masking belt 114 to dampen tension variations and vibration induced in the masking belt by applying force to the masking belt as the masking belt moves along its path. The belt pulleys 134 otherwise help guide the masking belt while leaving reduction of trans-linear motion of the masking belt to be mainly addressed by the drive wheel 118 and the tracking rollers 130. In the depicted implementation, only the drive wheel 118 is driven by a motive member such as a motor although other implementations can have other drive arrangements. A sealing belt 136 extends around a major portion of the circumference of the drive wheel 118 and partially around an idler pulley 140. The sealing belt 136 is axially mid-positioned on the drive wheel 118 to be in sequential alignment with serial portions of the lead frame 102 by riding in a belt groove 138 located around the circumference of the drive wheel 118, as shown in FIG. 1. The sealing belt 136 serves to seal the first side 102*a* of serial portions of the lead frame 102 from plating solution 108 as they sequentially travel through the tank 106.

To help maintain a seal between the first side 102*a* of serial portions of the lead frame 102 and serial portions of the sealing belt 136, and also a seal between serial portions of the masking belt 114 and serial portions of the second side 102*b* of the lead frame 102, a spring loaded compliance arm 141, shown in FIG. 2, is positioned to press against serial portions of the masking belt and the lead frame near the point at which they sequentially engage with the pins 128 of the drive wheel 118.

For the lead frame 102 depicted in FIG. 5, a set of four tines 142 of each of the parts 104 are plated. As shown in FIG. 6, each of the sets of tines 142 is exposed to the plating solution 108 through one of the openings 112. The set of tines 142 passes by the fluted anode band 122 through which the plating solution 108 passes through a plurality of flutes 144, as shown in FIG. 7, to be directed near and onto the second side 102*b* of the set of tines 142.

Figure 8:
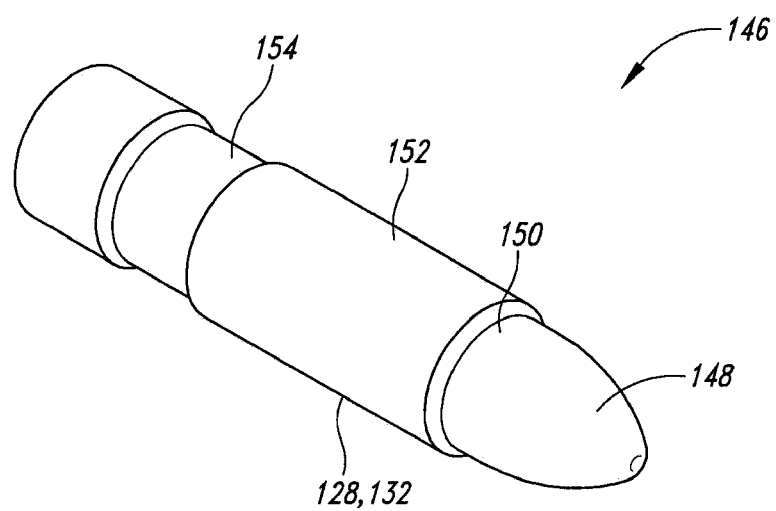
FIG. 8 is an enlarged, isometric view of a representative pin profile.
Figure 9:
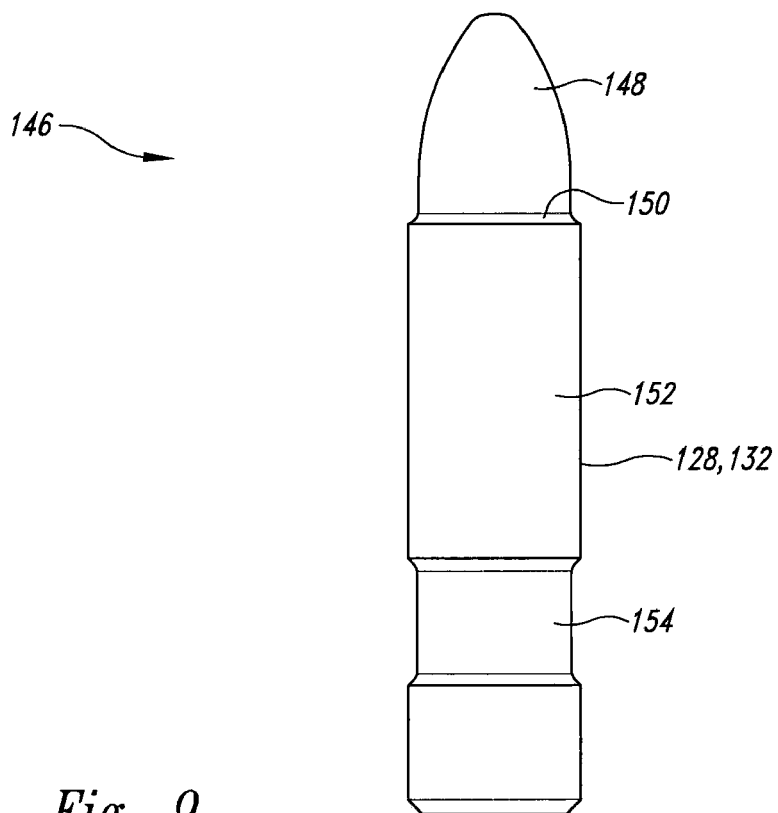
FIG. 9 is a side elevational view of the pin profile of FIG. 8.

The pins 128 of the drive wheel 118 have a profile that allows smooth entry and release of the lead frame 102 and the masking belt 114. The pins 132 of the tracking rollers 130 have a profile that allows smooth entry and release of the masking belt 114. A representative pin profile 146 for the pins 128 and the pins 132 is shown in FIGS. 8 and 9 as having a tapered end portion 148 that guides entry and release of the lead frame 102 and/or masking belt 114.

A curved section 150 provides adjustment for the lead frame 102 and/or masking belt 114 to transition from the tapered end portion 148 to a cylindrical portion 152 with relatively larger diameter to temporarily retain the lead frame 102 and/or masking belt 114 to maintain alignment. Material selection for the pins 128 of the drive wheel 118 generally are electrically non-conductive for practical orders of magnitude. Material selection for the pins 128 of the drive wheel 118 and the pins 132 of the tracking rollers 130 have high abrasion resistance and high tensile strength. For instance, ceramic materials can be used for the pins 128 of the drive wheel 118 and stainless steel materials can be used for pins 132 of the tracking rollers 130. A recessed portion 154 receives the side screw 129 to retain the pins 128 in the drive wheel 118 and the pins 132 in the tracking rollers 130.

Figure 10:
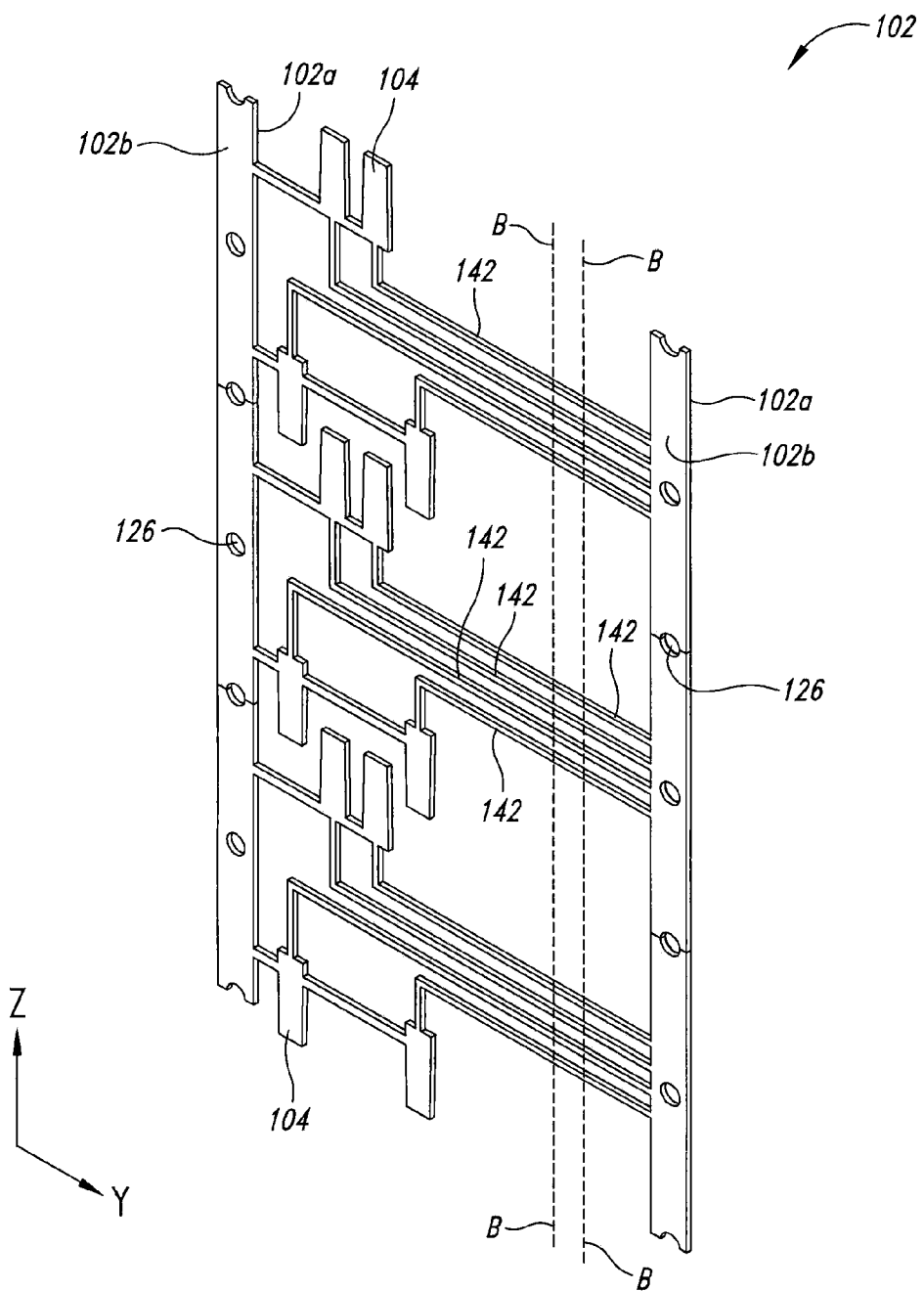
FIG. 10 is an isometric view of an alternative lead frame configured for strip plating.

An alternative strip version of the lead frame 102 is shown in FIG. 10 having the portions of the tines 142 to be plated exclusively oriented within two illustrative boundary lines, B, running parallel with the longitudinal dimension, Z, of the lead frame. Since the only portions of the lead frame 102 within the two boundary lines, B, are to be plated on the second side 102b, an alternative version of the masking belt 114 can be used that need only be precisely registered with the lead frame regarding the transverse dimension, Y, of the lead frame.

Figure 11:
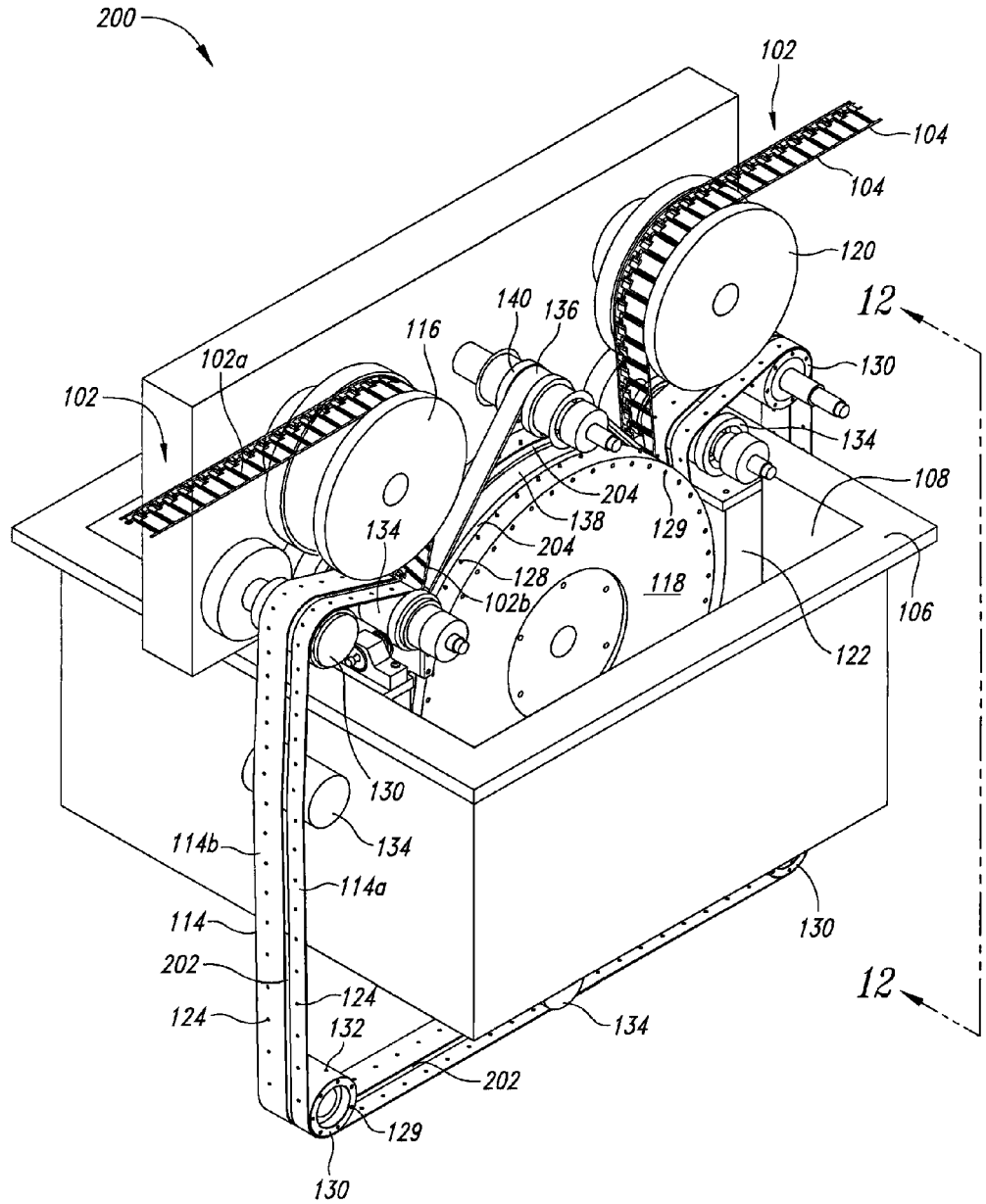
FIG. 11 is an isometric view of an alternative continuous plating system with mask registration for strip plating.
Figure 12:
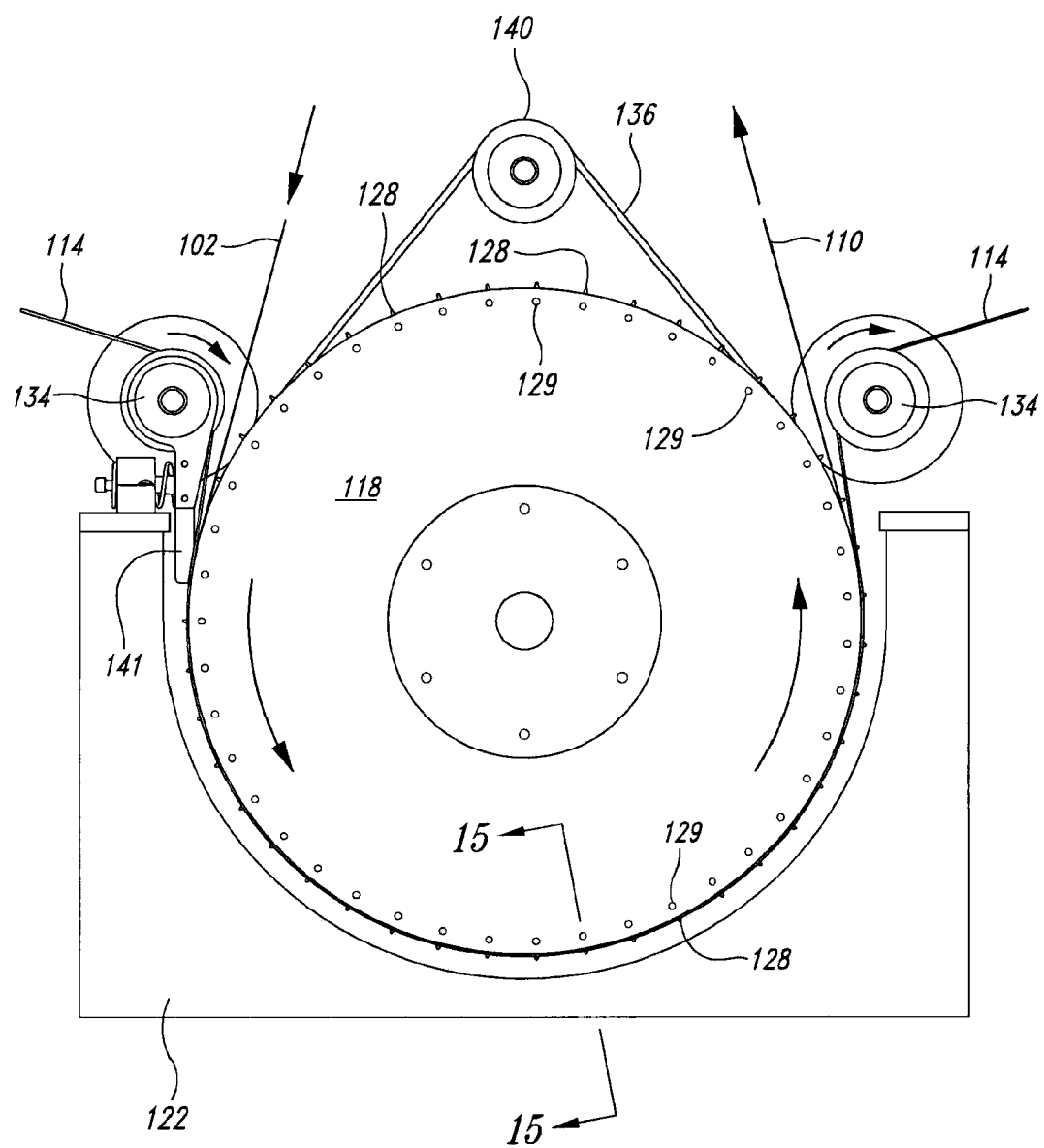
FIG. 12 is an enlarged, cross-sectional view of a portion of the alternative plating system substantially along the line 12-12 of FIG. 11.
Figure 13:
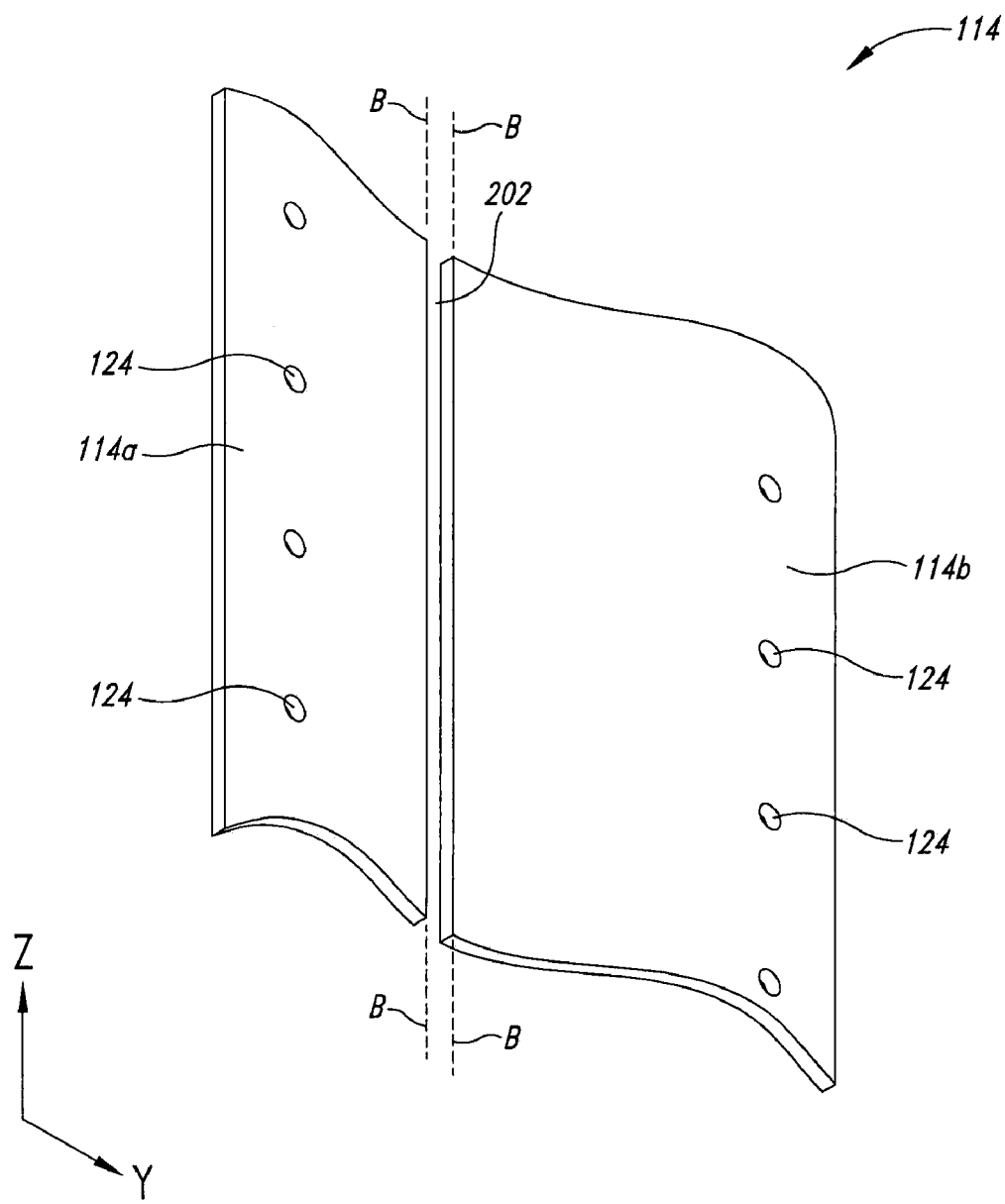
FIG. 13 is an enlarged fragmentary view of the alternative masking belt of the alternative plating system.
Figure 14:
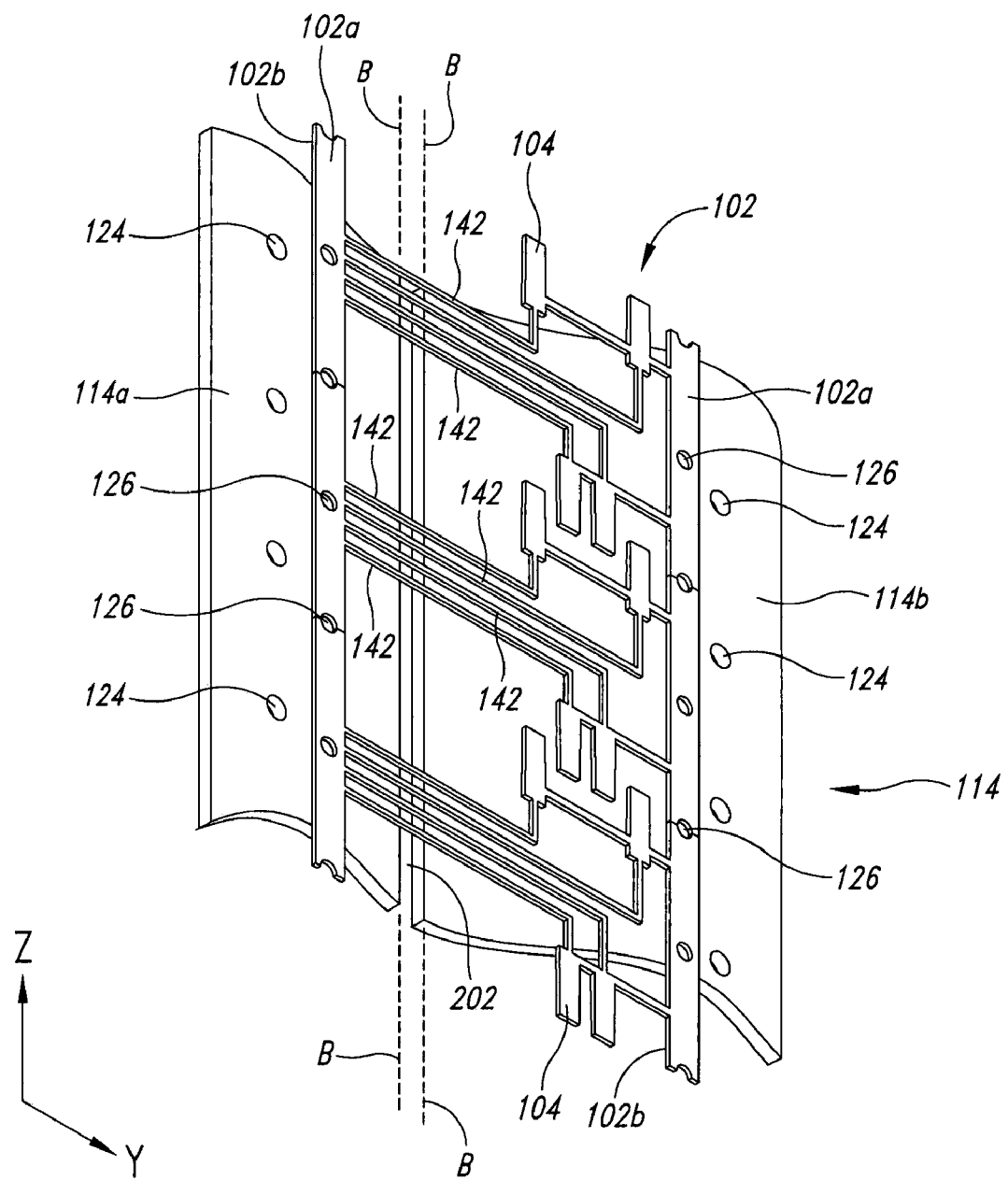
FIG. 14 is an enlarged section view of the alternative masking belt coupling with the alternative lead frame of the alternative plating system.
Figure 15:
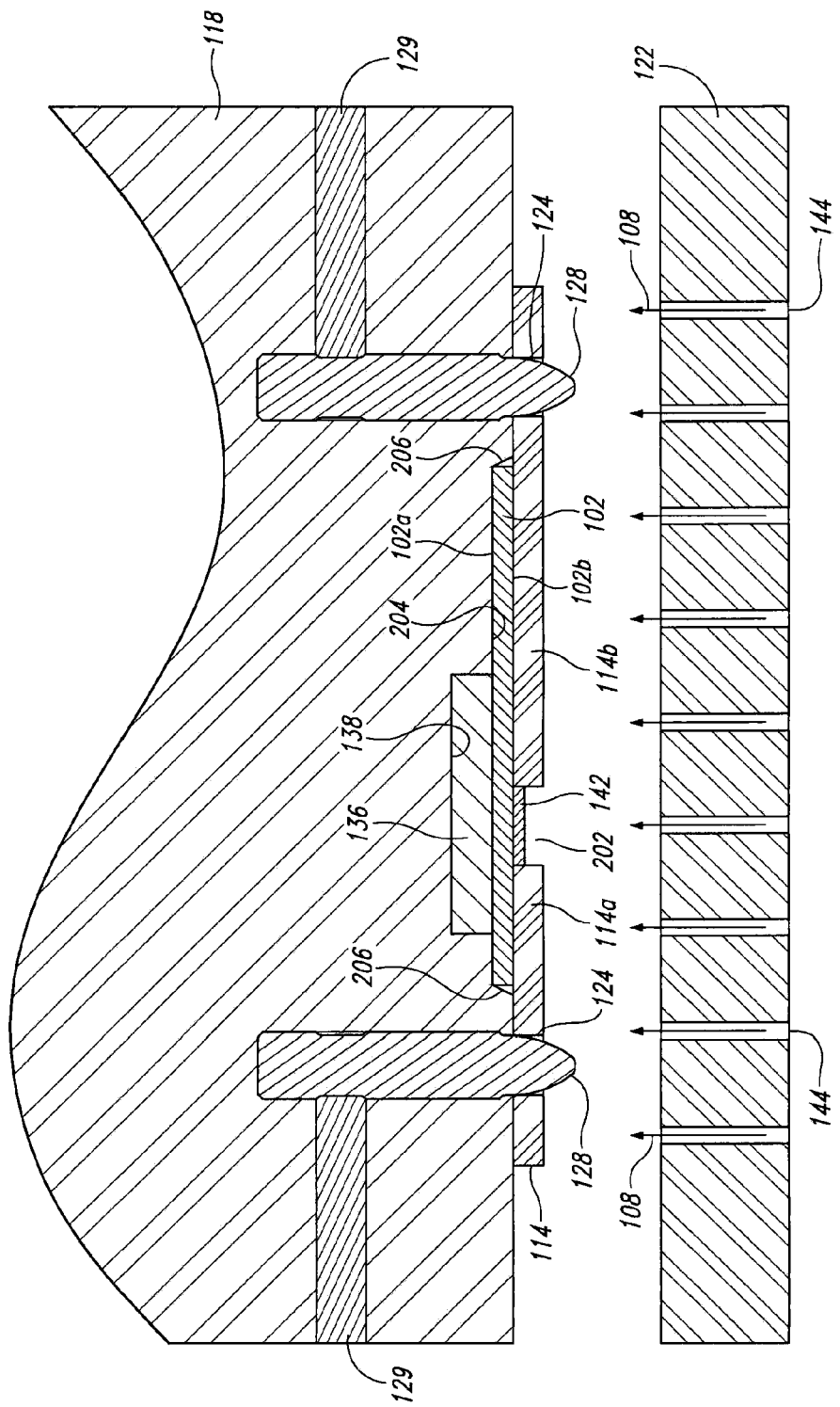
FIG. 15 is a cross-sectional view of the alternative plating system taken substantially along the line 16-16 of FIG. 33.

Consequently, an alternative continuous plating system 200, shown in FIG. 11 and FIG. 12, generally has most of the components of the continuous plating system 100, however, the masking belt 114 has a strip opening 202 running longitudinally along the masking belt so that the masking belt is actually two belts 114a and 114b transversely spaced by the width of the strip opening. In turn, the width of the strip opening 202, better shown in FIG. 13 and FIG. 14, is the distance in the transverse dimension, Y, between the two boundary lines, B, so that only that the portion of the second side 102b of the tines 142 that needs to plated is exposed to the plating solution 108. The drive wheel 118 for the alternative continuous plating system 200, better shown in FIG. 15, includes a lead frame groove 204 with beveled sides 206 to receive the lead frame 102 and prevent excessive transverse motion of the lead frame without requiring the guide holes 126 of the lead frame 102 to be received by the pins 128 of the drive wheel.

Figure 16:
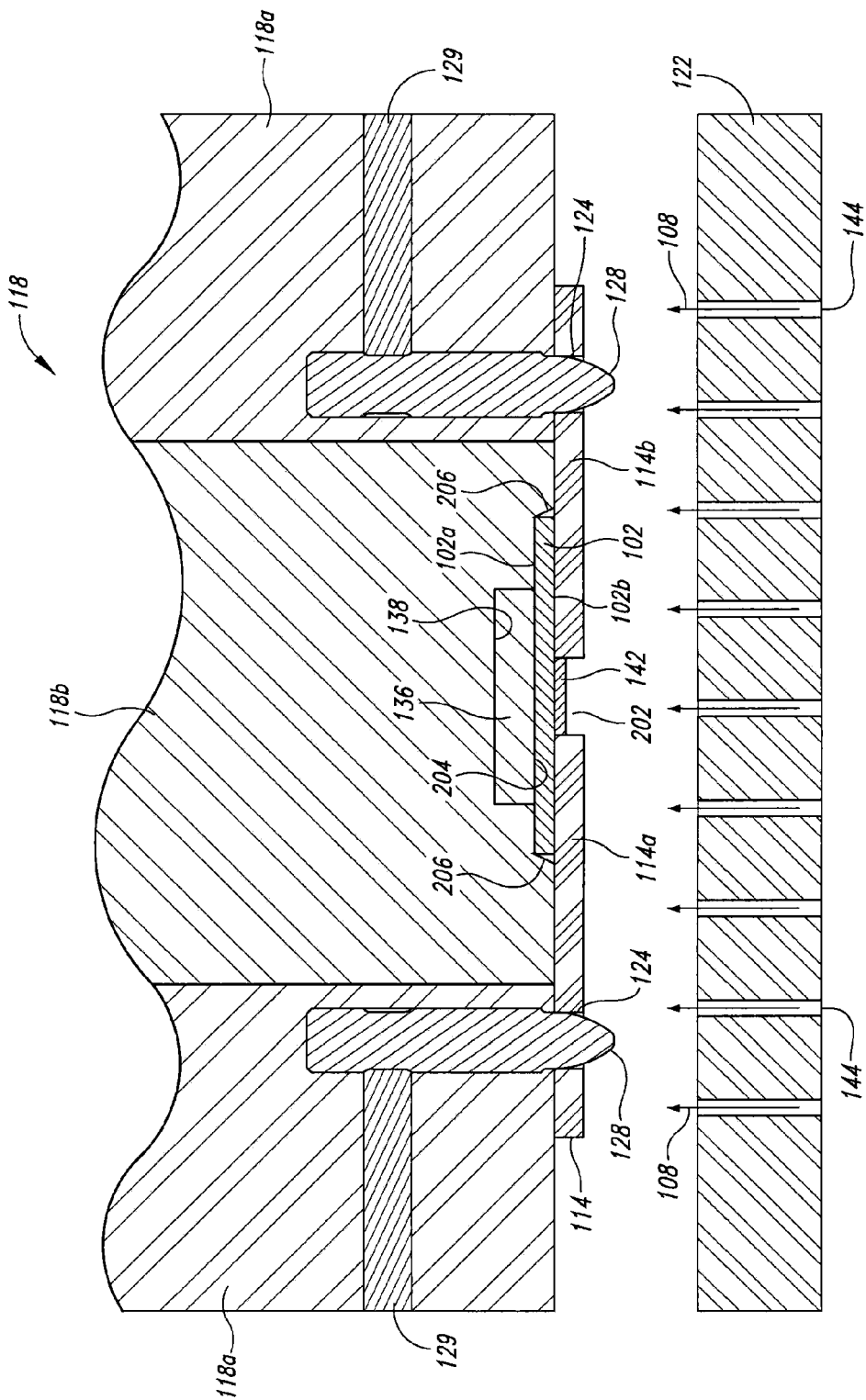
FIG. 16 is a cross-sectional view of the alternative plating system having an alternative drive wheel.

A second implementation of the drive wheel 118, shown in FIG. 16 for the alternative continuous plating system 200 has two outer sections 118a and an inner section 118b. The two outer sections 118a and the inner section 118b can be uncoupled from one another to exchange different versions of the inner section 118b that may have different sizing or transverse positioning of the lead frame groove 204 and/or the belt groove 138 as exemplified by differences in positioning shown in FIG. 15 and FIG. 16.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for plating a portion of each of a plurality of serially arranged parts of a lead frame with a plating solution, the lead frame having a plurality of guide holes, the method comprising:
    providing a tank containing the plating solution;
    providing a masking belt having a longitudinally extending opening and a plurality of guide holes;
    providing a drive wheel having a plurality of pins, the drive wheel being at least partially submerged in the plating solution;
    providing a plurality of tracking rollers each having a plurality of pins;
    sequentially engaging the plurality of pins of the drive wheel with the plurality of guide holes of the masking belt, and positioning the lead frame in the groove of the drive wheel to sequentially register each of the portions of the plurality of serially arranged parts of a lead frame with the opening of the masking belt;
    sequentially passing the plurality of serially arranged parts through the plating solution in the tank; and
    sequentially engaging the plurality of pins of each of the plurality of tracking rollers with the plurality of guide holes of the masking belt to assist in maintaining alignment of the masking belt and the registration of the opening with the portions of the plurality of serially arranged parts.

2. A method for plating a portion of each of a plurality of serially arranged parts of a lead frame with a plating solution, the lead frame having a plurality of guide holes, the method comprising:
    positioning a pair of laterally spaced apart masking belts to define a longitudinally oriented opening therebetween, each of the pair of masking belts comprising a plurality of guide holes;
    positioning a rotatable drive wheel partially in the plating solution, the drive wheel having a plurality of outwardly projecting pins and a peripheral groove;
    engaging the groove of the drive wheel with the lead frame; and
    engaging the plurality of pins with the plurality of guide holes of each of the pair of masking belts to sequentially register the opening defined between the pair of masking belts with the portions of the plurality of serially arranged parts of the lead frame, whereby the opening is aligned with the portions of the plurality of serially arranged parts of the lead frame to expose the portions to the plating solution.

3. A method comprising:
    positioning a pair of laterally spaced apart masking belts to define a longitudinally oriented opening therebetween, each of the pair of masking belts comprising a plurality of guide holes;
    positioning a rotatable drive wheel partially in a plating solution, the drive wheel having a plurality of outwardly projecting pins and a peripheral groove;
    positioning a lead frame in the groove of the drive wheel, the lead frame comprising a plurality of serially arranged parts, and a plurality of guide holes; and
    engaging the plurality of pins with the plurality of guide holes of each of the pair of masking belts to sequentially register the opening defined between the pair of masking belts with the plurality of serially arranged parts of the lead frame, whereby the opening is aligned with the plurality of serially arranged parts of the lead frame to expose portions of the plurality of serially arranged parts to the plating solution.

4. The method of claim 3, wherein each of the serially arranged parts of the lead frame has a plurality of tines, the portions of the plurality of serially arranged parts exposed to the plating solution comprising at least a portion of each of the tines.

5. The method of claim 3, wherein the lead frame has a first side opposite a second side, the first side contacting the pair of masking belts, and the method further comprises:
covering a portion of the second side of the lead frame with a sealing belt.

6. The method of claim 3, wherein the drive wheel is made from a substantially electrically non-conductive material.

7. The method of claim 3, wherein the drive wheel is made from an acrylic plastic.

8. The method of claim 3, further comprising:
positioning a compliance arm to sequentially apply force on serially arranged portions of the pair of masking belts to further engagement of the plurality of pins with the plurality of guide holes of each of the pair of masking belts.

9. The method of claim 3, further comprising:
positioning a plurality of belt pulleys to apply force to the pair of masking belts.

10. The method of claim 3, further comprising:
positioning a negatively charged cathode drum to sequentially contact the serially arranged parts of the lead frame before the lead frame is positioned inside the groove of the drive wheel.

11. The method of claim 3, further comprising:
positioning a negatively charged cathode drum to contact the serially arranged parts of the lead frame after the lead frame is positioned inside the groove of the drive wheel.

12. The method of claim 3, wherein the periphery of the drive wheel is circular, and the method further comprises:
positioning a concentric band in close proximity to the drive wheel.

13. The method of claim 12, wherein the concentric band has flutes to direct the plating solution toward the drive wheel.

14. The method of claim 12, wherein the concentric band is positively charged.

15. The method of claim 12, wherein the drive wheel has a circumference, and the concentric band has a profile inverse to a portion of the drive wheel circumference.

16. The method of claim 2, wherein the groove of the drive wheel is a first groove, the drive wheel includes a second groove, the lead frame has a first side opposite a second side, the first side contacting the pair of masking belts, and the method further comprises:
positioning a sealing belt in the second groove of the drive wheel between the lead frame and the drive wheel, the sealing belt covering a portion of the second side of the lead frame.

17. The method of claim 2 for use with the lead frame having a first side opposite a second side, the first side contacting the pair of masking belts, the method further comprising:
covering a portion of the second side of the lead frame with a sealing belt.

18. The method of claim 2, wherein the drive wheel is made from a substantially electrically non-conductive material.

19. The method of claim 2, wherein the drive wheel is made from an acrylic plastic.

20. The method of claim 2, further comprising:
positioning a compliance arm to sequentially apply force on serially arranged portions of the pair of masking belts to further engagement of the plurality of pins with the plurality of guide holes of each of the pair of masking belts.

21. The method of claim 2, further comprising:
positioning a plurality of belt pulleys to apply force to the pair of masking belts.

22. The method of claim 2, further comprising:
positioning a negatively charged cathode drum to sequentially contact the serially arranged parts of the lead frame before the lead frame engages the groove of the drive wheel.

23. The method of claim 2, further comprising:
positioning a negatively charged cathode drum to contact the serially arranged parts of the lead frame after the lead frame engages the groove of the drive wheel.

24. The method of claim 2, wherein the periphery of the drive wheel is circular, and the method further comprises:
positioning a concentric band in close proximity to the drive wheel.

25. The method of claim 24, wherein the concentric band has flutes to direct the plating solution toward the drive wheel.

26. The method of claim 24, wherein the concentric band is positively charged.

27. The method of claim 24, wherein the drive wheel has a circumference, and the concentric band has a profile inverse to a portion of the drive wheel circumference.

28. The method of claim 2, wherein the groove of the drive wheel is a first groove, the drive wheel includes a second groove, the lead frame has a first side opposite a second side, the first side contacting the pair of masking belts, and the method further comprises:
positioning a sealing belt in the second groove of the drive wheel between the lead frame and the drive wheel, the sealing belt covering a portion of the second side of the lead frame.

29. A method for plating a portion of each of a plurality of serially arranged parts of a lead frame with a plating solution, the lead frame having a plurality of guide holes, the method comprising:
providing a tank containing the plating solution;
providing a pair of laterally spaced apart masking belts defining having a longitudinally extending opening therebetween, each of the pair of masking belts comprising a plurality of guide holes;
providing a rotatable drive wheel partially out of the plating solution within the tank and partially in the plating solution within the tank, the drive wheel having a periphery, a plurality of outwardly projecting pins and a groove, the plurality of pins being positioned along the periphery of the drive wheel;
providing a plurality of tracking rollers each having a plurality of pins positioned along a periphery of the tracking roller to sequentially engage with the plurality of guide holes of each of the pair of masking belts;
sequentially engaging the plurality of pins of the drive wheel with the plurality of guide holes of each of the pair of masking belts, and positioning the lead frame in the groove of the drive wheel to sequentially register each of the portions of the plurality of serially arranged parts of a lead frame with the opening defined between the pair of masking belts;
sequentially passing the plurality of serially arranged parts through the plating solution in the tank; and
sequentially engaging the plurality of pins of each of the plurality of tracking rollers with the plurality of guide holes of each of the pair of masking belts to assist in maintaining alignment of the pair of masking belts and the registration of the opening with the portions of the plurality of serially arranged parts.

* * * * *